United States Patent
Watanabe et al.

(10) Patent No.: US 10,332,747 B1
(45) Date of Patent: Jun. 25, 2019

(54) SELECTIVE TITANIUM NITRIDE DEPOSITION USING OXIDES OF LANTHANUM MASKS

(71) Applicant: GLOBALFOUNDRIES INC., Grand Cayman (KY)

(72) Inventors: Koji Watanabe, Voorheesville, NY (US); Meng Zhu, Niskayuna, NY (US); Brian A. Cohen, Delmar, NY (US); Matthew T. Whitman, Saratoga Springs, NY (US); Balaji Kannan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/878,519

(22) Filed: Jan. 24, 2018

(51) Int. Cl.
  *H01L 21/8234* (2006.01)
  *H01L 21/285* (2006.01)
  *H01L 29/49* (2006.01)
  *H01L 29/51* (2006.01)
  *C23C 16/34* (2006.01)
  *C23C 16/455* (2006.01)
  *C23C 16/04* (2006.01)
  *H01L 21/28* (2006.01)

(52) U.S. Cl.
  CPC ...... *H01L 21/28562* (2013.01); *C23C 16/042* (2013.01); *C23C 16/34* (2013.01); *C23C 16/45525* (2013.01); *H01L 21/28088* (2013.01); *H01L 29/4966* (2013.01); *H01L 29/517* (2013.01)

(58) Field of Classification Search
  CPC .............. H01L 21/823437; H01L 21/823842
  See application file for complete search history.

(56) References Cited

U.S. PATENT DOCUMENTS

| | | | |
|---|---|---|---|
| 7,623,338 B2 | 11/2009 | Won | |
| 8,343,865 B2 | 1/2013 | Watanabe et al. | |
| 8,735,987 B1 | 5/2014 | Hoffmann et al. | |
| 9,576,980 B1 | 2/2017 | Basker et al. | |
| 2003/0031794 A1 | 2/2003 | Tada et al. | |
| 2004/0166637 A1* | 8/2004 | Ito | H01L 29/0696 438/270 |
| 2006/0088962 A1 | 4/2006 | Herman et al. | |
| 2006/0172474 A1 | 8/2006 | Wajda et al. | |
| 2009/0206415 A1 | 8/2009 | Chiang et al. | |
| 2010/0044783 A1 | 2/2010 | Chuang et al. | |
| 2011/0003468 A1* | 1/2011 | Song | H01L 29/4236 438/589 |
| 2011/0175167 A1 | 7/2011 | Watanabe et al. | |

* cited by examiner

*Primary Examiner* — Thomas L Dickey
(74) *Attorney, Agent, or Firm* — Gibb & Riley, LLC; Francois Pagette

(57) ABSTRACT

In an exemplary method, a dielectric layer is deposited on a substrate. A masking layer is formed over a first region and a second region of the dielectric layer. The masking layer is made of an oxide of lanthanum. The masking layer is removed from the second region of the dielectric layer. A work function layer is formed directly on only the second region of the dielectric layer. The work function layer is made of titanium nitride that is formed by using a combination of titanium tetrachloride and ammonia (TiCl4/NH3).

17 Claims, 23 Drawing Sheets

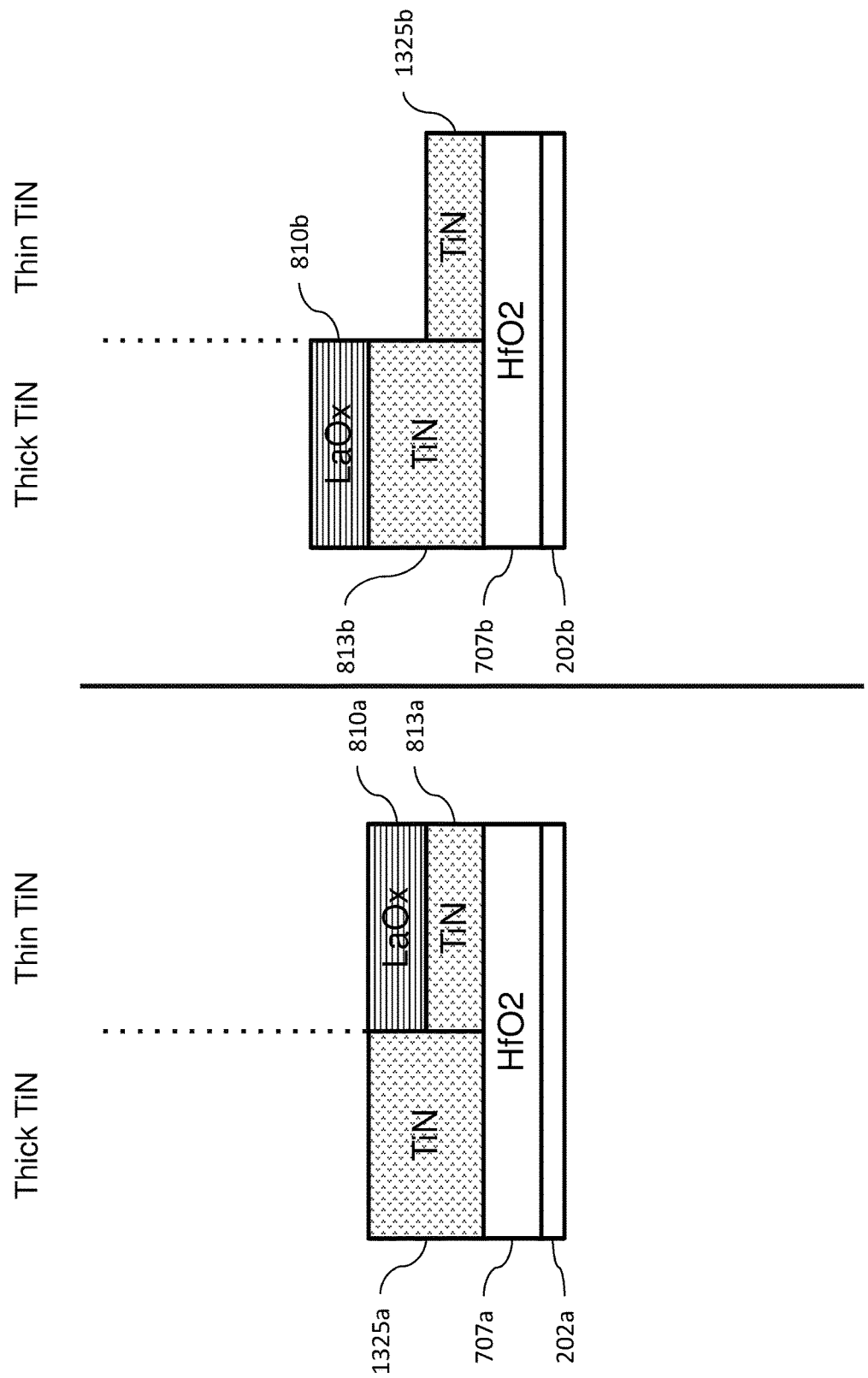

SELECTIVE TITANIUM NITRIDE DEPOSITION USING OXIDES OF LANTHANUM MASKS

BACKGROUND

The present disclosure relates to semiconductor device fabrication, and, more specifically, to methods of forming gate structures using selective metal deposition.

Photolithography is a commonly used technique in the manufacture of semiconductor devices. The process uses patterns to define regions on a substrate. More specifically, with photolithography, a photoresist layer may be formed on a substrate, such as a silicon wafer, and then the resist layer is covered with a mask containing a pattern. The mask is exposed to radiation, such as ultraviolet light (UV), which is transmitted through transparent areas of the mask to cause a chemical reaction in corresponding regions of the photoresist. In other words, in the course of processing integrated circuits and the like in semiconductor devices, a standard sequence may involve putting down a layer of material, depositing a layer of photoresist on the layer of material, patterning the photoresist by projecting a pattern on it, and developing the resist to produce a pattern of open areas that expose the material, with the other areas of the material still covered by the resist.

Complementary metal-oxide semiconductor (CMOS) devices typically employ at least one gate that is separated from a conducting channel (or channels) of the device by a gate dielectric material. Examples of such CMOS devices that employ a gate dielectric material include, but are not limited to, field effect transistors (FETs).

SUMMARY

Devices and methods herein provide a process to prevent a target surface of an oxide of lanthanum (LaOx) from being exposed on single patterning of the target surface. In the process, multiple layers of titanium nitride (TiN) may be formed without oxidized interfaces.

According to an exemplary method herein, a dielectric layer is deposited on a substrate. A masking layer is formed over a first region and a second region of the dielectric layer; the masking layer is made of a lanthanum oxide. The masking layer is removed from the second region of the dielectric layer. The masking layer and the second region of the dielectric layer are exposed to a titanium material to form a titanium nitride layer directly on only the second region of the dielectric layer. The lanthanum oxide prevents the titanium nitride from being formed on the masking layer.

According to methods herein, a substrate having a top surface and a bottom surface is provided. A dielectric layer is deposited on the top surface of the substrate. The dielectric layer has a top surface and a bottom surface, and the bottom surface of the dielectric layer contacts the top surface of the substrate. A first work function layer is deposited on the top surface of the dielectric layer. The first work function layer has a top surface and a bottom surface, and the bottom surface of the first work function layer contacts the top surface of the dielectric layer. A masking layer of a lanthanum oxide is formed over the first work function layer. A portion of the masking layer and a portion of the first work function layer are selectively removed leaving an exposed region of the dielectric layer. A second work function layer made of titanium nitride is formed directly on the exposed region of the dielectric layer by exposing the masking layer and the exposed portion of the dielectric layer to a titanium material. The lanthanum oxide prevents the titanium nitride from being formed on the masking layer.

According to some semiconductor devices herein, a semiconductor device includes a transistor of a first type. The transistor includes a source region, a drain region, and a channel region between the source region and the drain region. A gate electrode overlies the channel region. The gate electrode includes a first work function material having a first height and a second work function material having a second height. The second work function material is made of titanium nitride. According to exemplary methods herein, depositing a dielectric layer on a substrate may form the gate electrode. A layer of the first work function material is deposited on the dielectric layer. A masking layer of a lanthanum oxide is formed over a first region and a second region of the first work function material. A portion of the masking layer and a portion of the first work function layer are selectively removed, leaving an exposed region of the dielectric layer. A second work function layer made of titanium nitride is formed directly on the exposed region of the dielectric layer by exposing the masking layer and the exposed portion of the dielectric layer to a titanium material. The lanthanum oxide prevents the titanium nitride from being formed on the masking layer.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
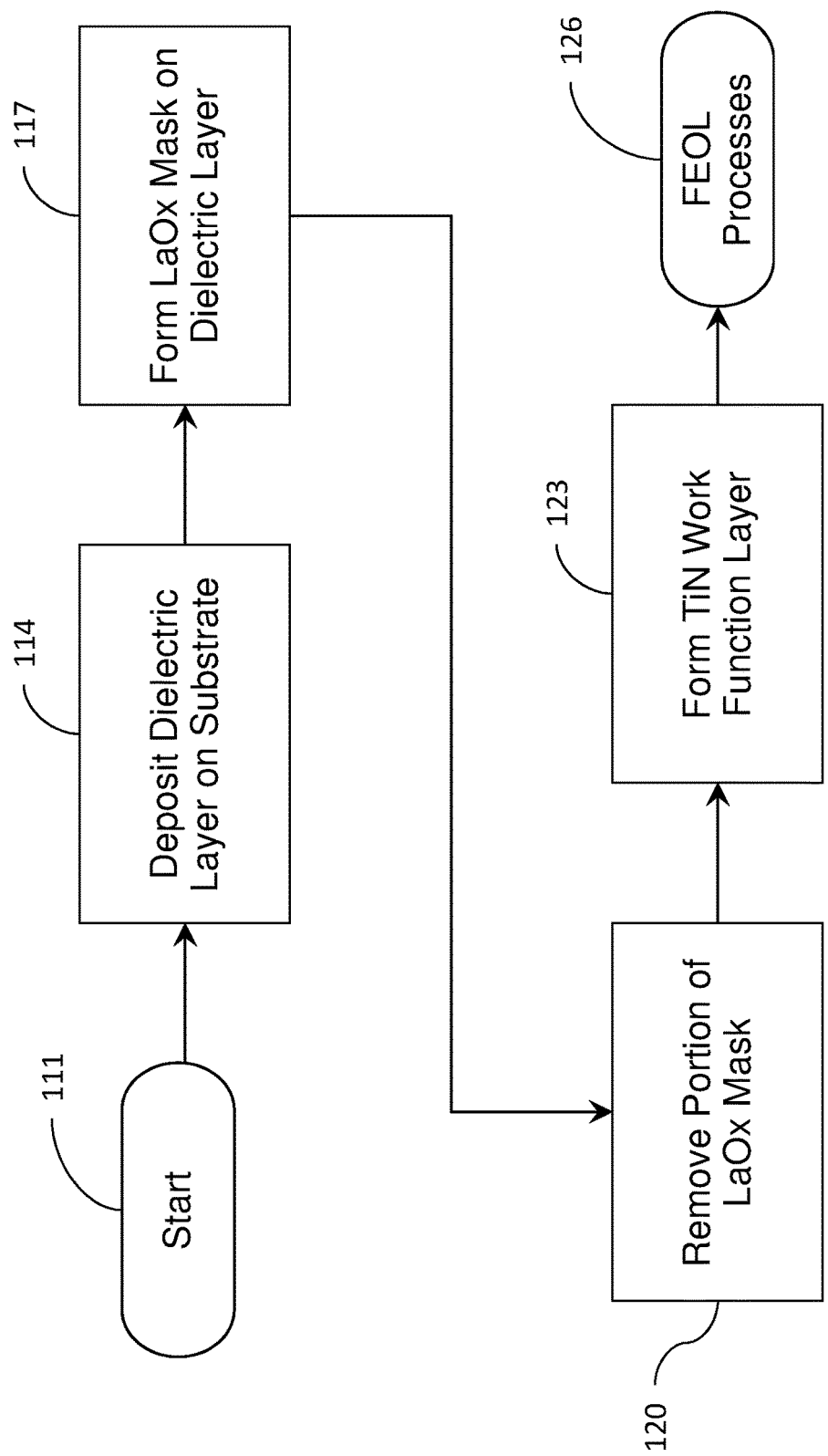
FIG. 1 is an illustration of a process flow according to devices and methods herein.

The disclosure will now be described with reference to a process for protection of the wafer edge during processing of a semiconductor wafer. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

The gate electrodes in PMOS transistors and NMOS transistors of a static random access memory (SRAM) based on the CMOS structure are usually connected to each other. If such devices are manufactured by a high-K/metal gate replacement procedure, however, the poly-Si and the gate dielectric layer in the gates of the PMOS and the NMOS is removed in different steps to be replaced by the corresponding conductive metal gate and gate dielectric layer.

Current processing of gate structures uses oxide layers between metal layers. But, patterning plans may etch only titanium nitride (TiN) on a lanthanum oxide (LaOx) surface. This can cause variations in threshold voltage of the resultant component. Double patterning plans can protect target lanthanum oxides with titanium nitride during the patterning but may require multiple masks. Additionally, an oxidized interface is formed on multi titanium nitride thickness patterning, which can cause high resistivity in the metal gate and variations in the threshold voltage.

Semiconductor device fabrication is typically a multiple step sequence of photolithographic and chemical processing steps during which electronic circuits are gradually created on a wafer made of semiconducting material. Etching may be used to remove layers from the surface of a wafer and to form trenches in the wafer during manufacturing. Etching, in conjunction with lithographic techniques, may be used to attack certain areas of a semiconductor surface in order to form recesses in the material or to otherwise remove portions of semiconductor layers. For many etching steps, part of the wafer is protected from the etchant by a masking material that resists etching.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many other steps performed. The complexity of microfabrication processes can be described by their mask count.

Optical lithography typically uses light against a photoresist. A photoresist is a light-sensitive material used to selectively expose a layer of material on a substrate. There are two types of photoresists. Positive photoresist, the most common type, becomes soluble in the basic developer when exposed; negative photoresist becomes insoluble in the developer. This chemical change allows some of the photoresist to be removed by a special solution, called "developer" by analogy with photographic developer. In other words, a positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The photoresist developer dissolves the unexposed portion of the photoresist.

Now, referring to the drawings, FIG. 1 shows an overview of the process flow for forming a gate structure of titanium nitride (TiN) using a layer of a lanthanum oxide (LaOx) as a mask according to devices and methods herein. The process starts at 111. Initially, a dielectric layer is deposited on a substrate, as indicated at 114. Then, at 117, a mask of an oxide of lanthanum is formed on the dielectric layer. A portion of the lanthanum oxide mask is removed, as indicated at 120. A layer of work function material, such as titanium nitride, is formed on exposed portions of the dielectric layer, as indicated at 123. The titanium nitride is formed by first exposing the substrate to titanium tetrachloride (TiCl4) and then to ammonia (NH3). The titanium tetrachloride (TiCl4) reacts with the lanthanum oxide (LaOx) at the surface of the mask by swapping an oxide with a chloride to form chlorides of lanthanum (La—Clx). This happens because chlorine atoms are more chemically active than oxygen atoms, such that the lanthanum has a higher chemical affinity for the chlorine than for the oxygen. In surface physics, this is sometimes called the sticking coefficient, used to describe the ratio of the number of adsorbate atoms (or molecules) that adsorb, or "stick", to a surface to the total number of atoms that impinge upon that surface. Therefore the TiCl4 does not land on the lanthanum oxide mask. Then, the substrate is exposed to NH3 and titanium nitride is formed by chemical reaction. The chemical reaction is: TiCl4+NH3=>TiN+HCl. Additional processing of the structure proceeds, as indicated at 126.

Figure 2:
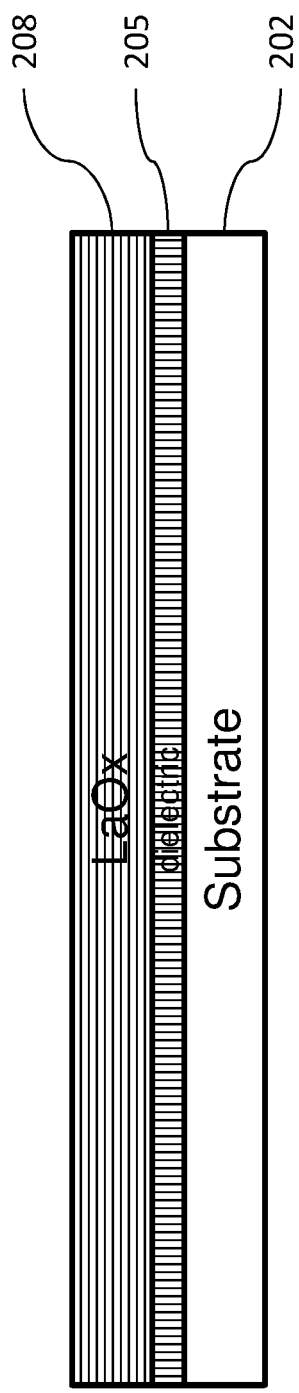
FIGS. 2-5 are cross-section diagrams showing a partially completed semiconductor structure illustrating manufacturing steps according to devices and methods herein.
Figure 3:
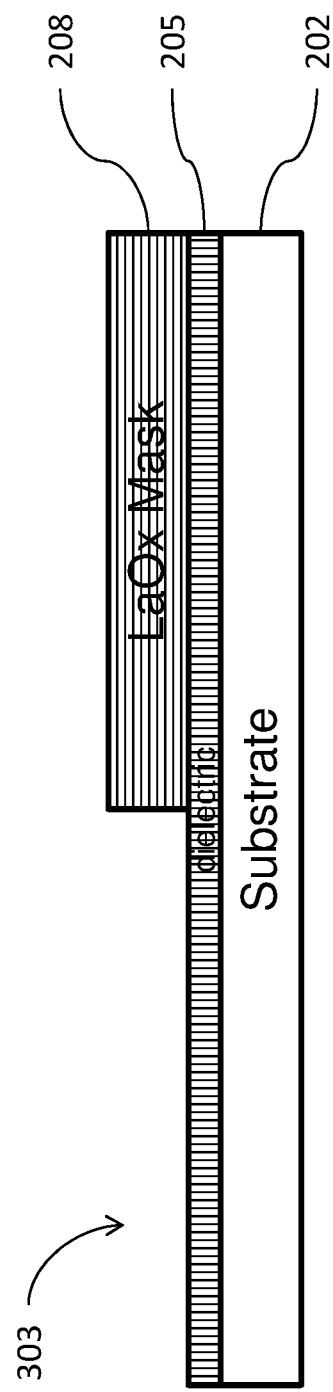
Figure 4:
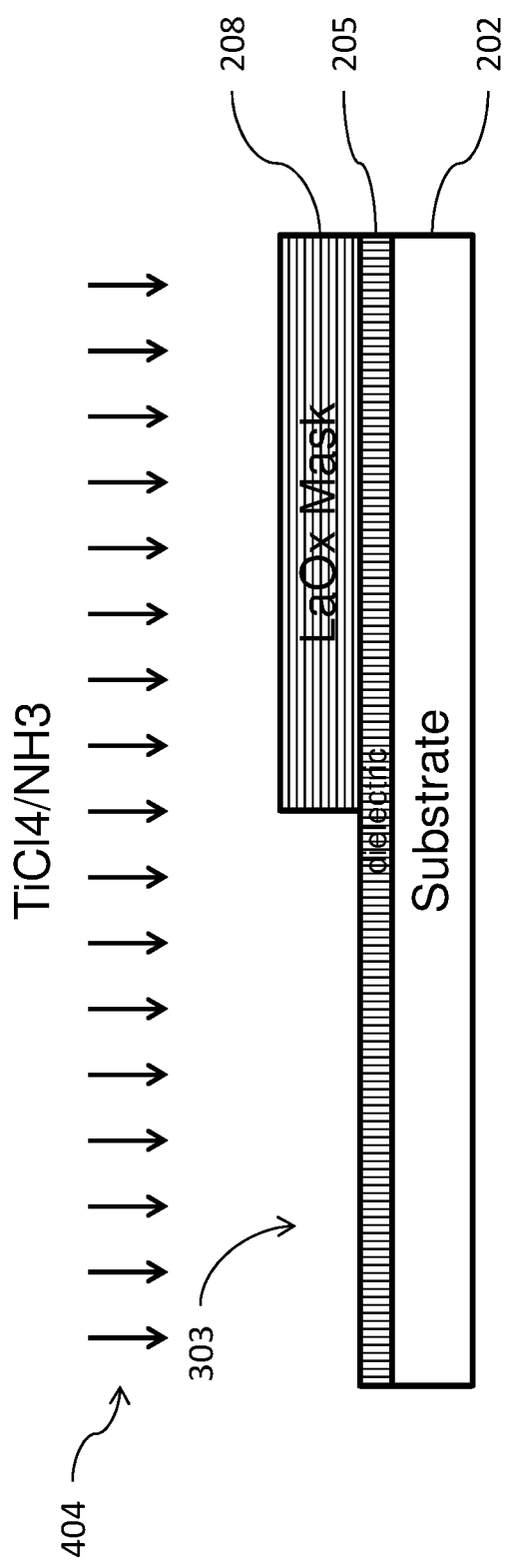
Figure 5:
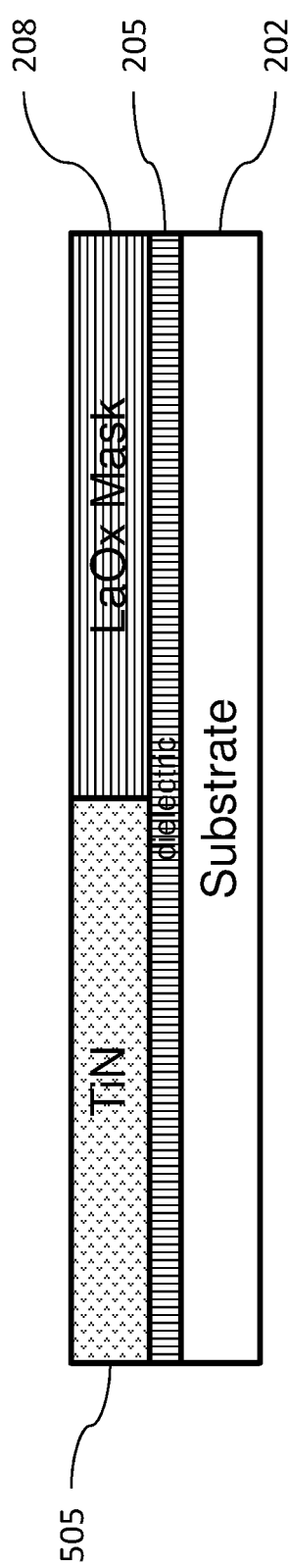

FIGS. 2-5 illustrate the structure through the various manufacturing steps according to embodiments of methods herein. In FIG. 2, a substrate 202 is provided. The substrate 202 may be any conventional semiconductor substrate such as, for example, a bulk silicon substrate or an active layer of semiconductor material of a silicon-on-insulator (SOI). A dielectric layer 205 is formed on the substrate 202. The dielectric layer 205 can be, for example, silicon oxide, a nitride, or any other suitable interlayer dielectric (ILD) material (e.g., borophosphosilicate glass (BPSG), tetraethyl orthosilicate (TEOS), fluorinated tetraethyl orthosilicate (FTEOS), etc.). A layer of lanthanum oxide 208 is formed on the dielectric layer 205, to serve as a mask. FIG. 3 shows a portion of the lanthanum oxide layer 208 has been removed, leaving an exposed region of the dielectric, indicated generally as 303. According to devices and methods herein, the portion of the lanthanum oxide layer 208 may be removed by patterning and etching the lanthanum oxide layer 208, using an appropriate photoresist (not shown), as would by known by one skilled in the relevant art. One or more conventional etch processes, such as a reactive ion etch (RIE), may be used to pattern the lanthanum oxide layer 208. The RIE process may be tailored to the material of the feature being etched. FIG. 4 shows titanium tetrachloride (TiCl4) and ammonia (NH3), indicated generally as 404, being supplied to the structure. The remaining portion of the lanthanum oxide layer 208 serves as a mask, such that a titanium nitride layer 505 is formed only on the exposed region of the dielectric 303, as shown in FIG. 5. The titanium nitride is formed by chemical reaction, as described below, so that there is minimal titanium nitride deposition on the remaining portion of the lanthanum oxide layer 208.

Figure 6:
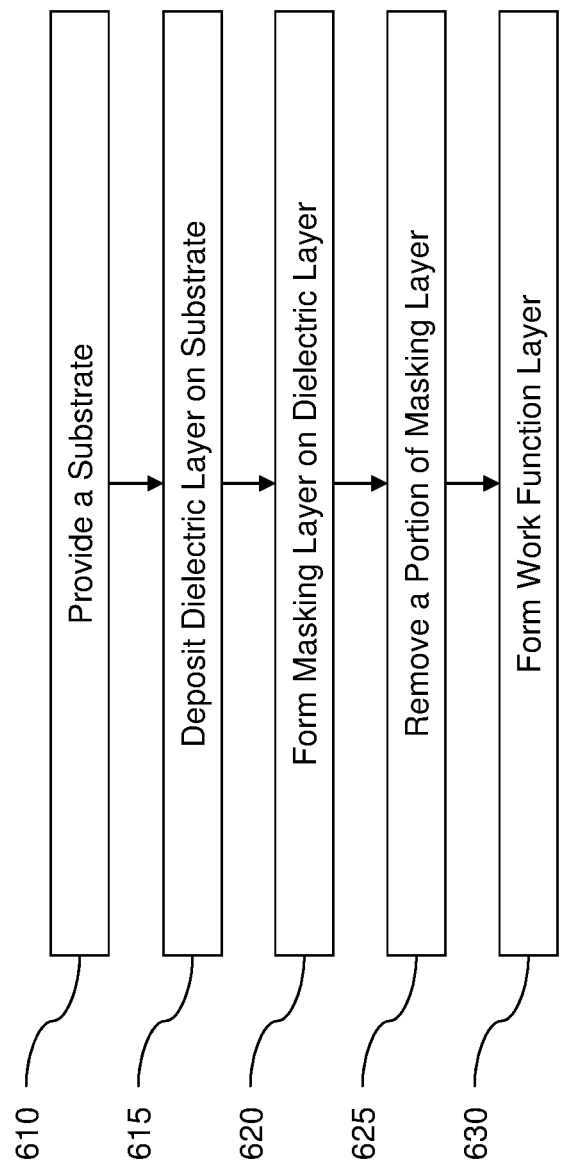
FIG. 6 is a flow diagram illustrating methods herein.

FIG. 6 is a flow diagram illustrating the processing flow of an exemplary method, such as described above. At 610, a substrate is provided (e.g., a bulk silicon substrate or any other suitable semiconductor substrate). A dielectric layer is deposited on the substrate (e.g., a silicon dioxide layer, hafnium dioxide, or any other suitable insulator layer), at 615. A masking layer is formed over a first region and a second region of the dielectric layer, at 620. According to exemplary methods herein, the masking layer may be made of lanthanum oxide. At 625, a portion of the masking layer is removed from the second region of the dielectric layer. The portion of the masking layer can be removed by patterning and etching the masking layer. A layer of work function material is formed directly on only the second region of the dielectric layer, at 630. The work function layer may be made of titanium nitride that can be formed by using a combination of titanium tetrachloride and ammonia (TiCl4/NH3), as described in further detail below.

Figure 7:
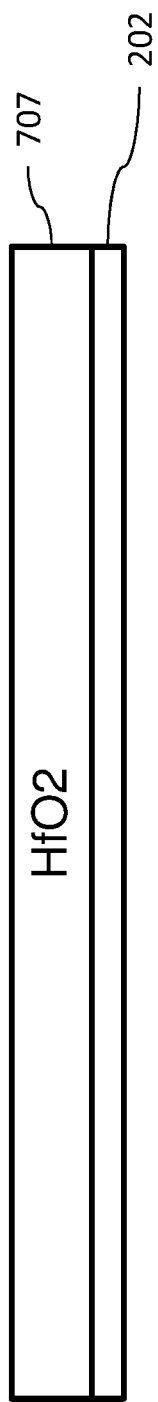
FIGS. 7-14 are cross-section diagrams illustrating a partially completed semiconductor structure formed according to devices and methods herein.
Figure 8:
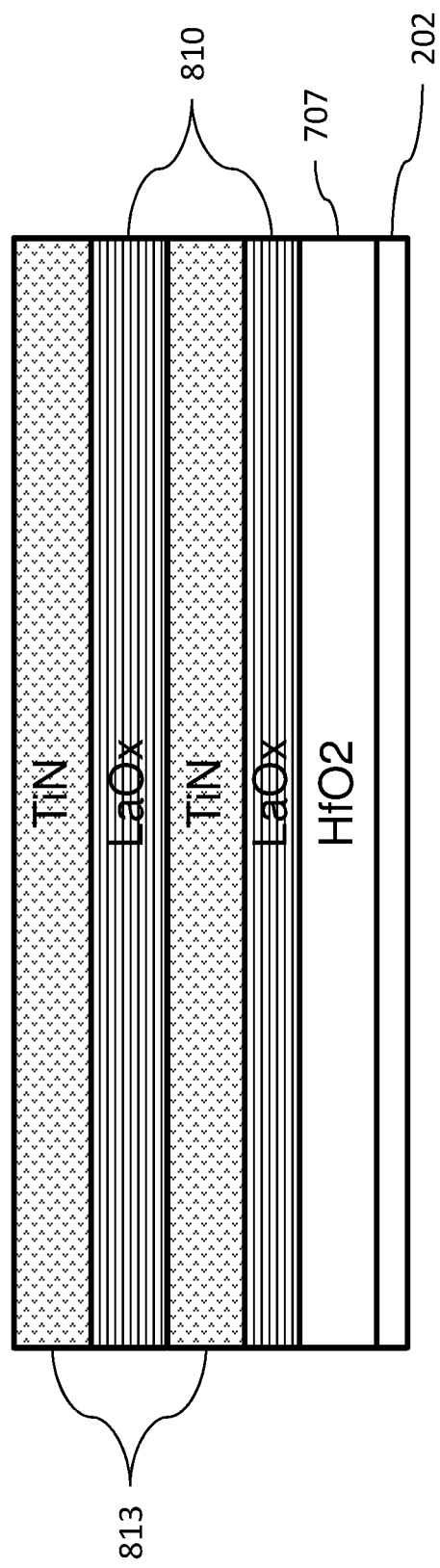

FIGS. 7-14 illustrate the structure through the various manufacturing steps according to a specific embodiment of methods herein. In FIG. 7, the dielectric layer, described above, may be a layer of hafnium dioxide (HfO2) 707. The HfO2 layer 707 may have been deposited on the substrate 202 and annealed. As described above, the substrate 202 may be any conventional semiconductor substrate such as, for example, a bulk silicon substrate or an active layer of semiconductor material of a silicon-on-insulator (SOI). The HfO2 layer 707 is formed on the substrate 202, and a post deposition annealing (PDA) process is performed. In FIG. 8, a stack of layers may be formed with alternating layers of lanthanum oxide (LaOx) 810 and titanium nitride (TiN) 813. Each of the layers of lanthanum oxide 810 and the layers of titanium nitride 813 may be formed by appropriate deposition, as would be known to one of ordinary skill in the art. For example, the layers 810, 813 may be formed using an atomic layer deposition (ALD) technique. Alternatively, a conformal deposition process, such as chemical vapor deposition (CVD), physical vapor deposition (PVD), or any other technique known in the art, may be used.

Figure 9:
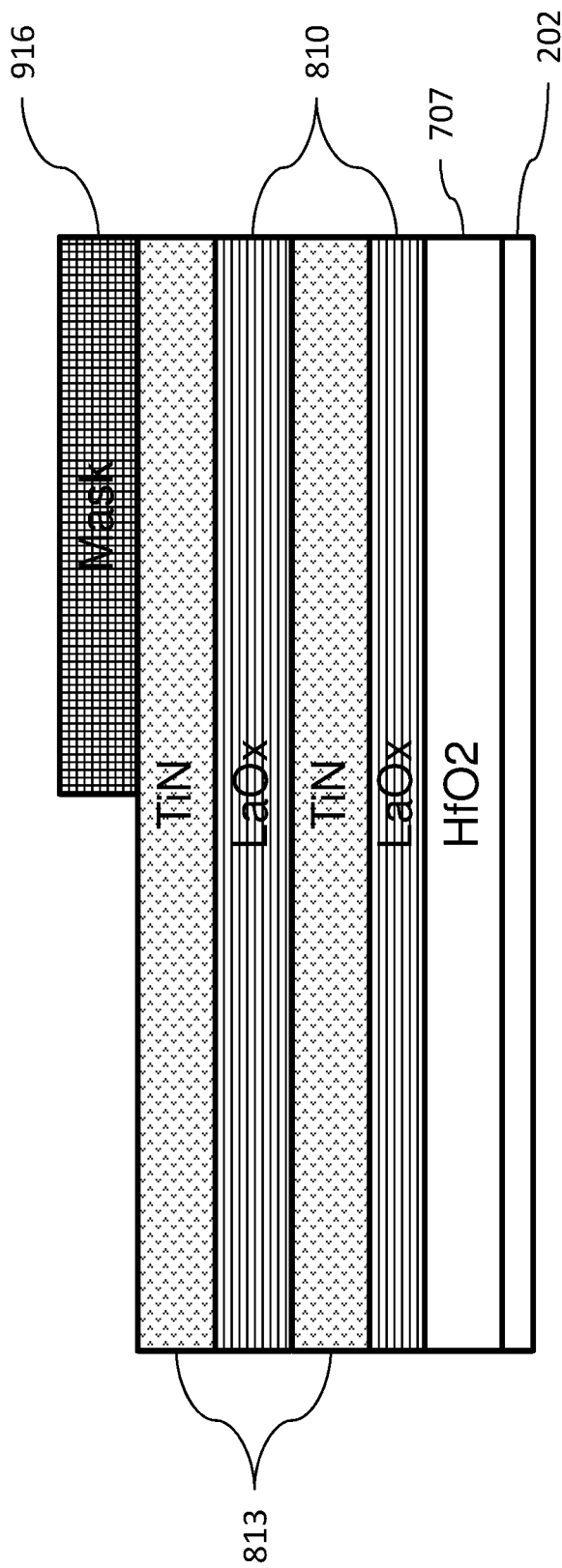
Figure 10:
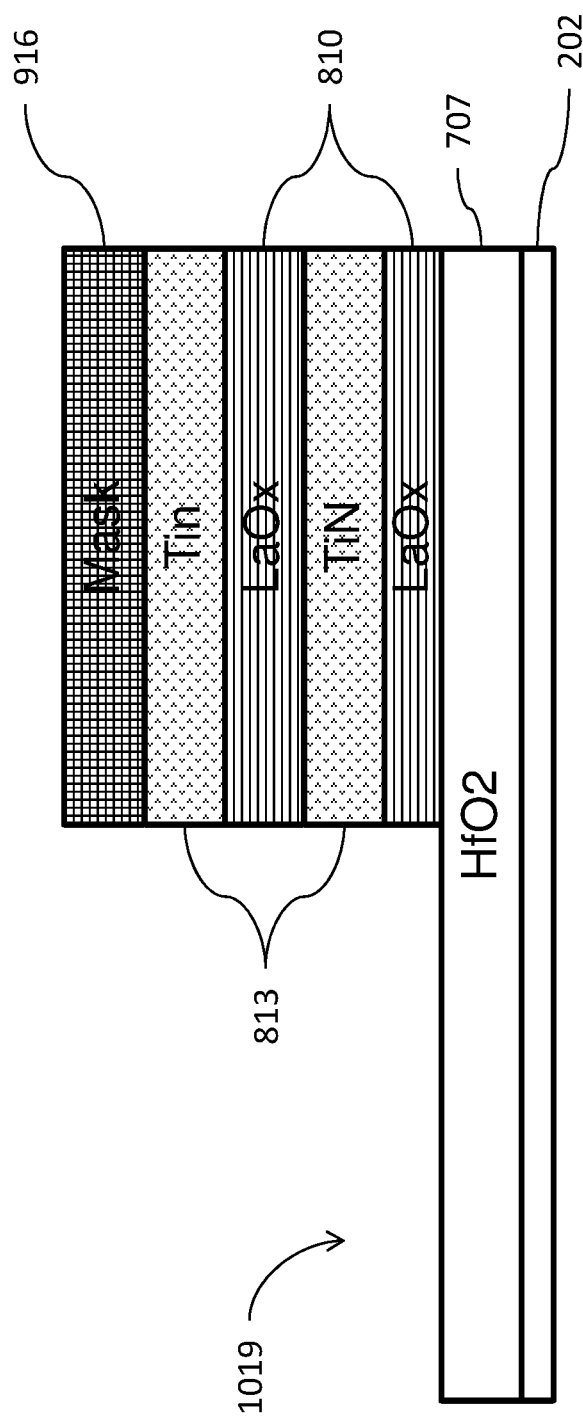
Figure 11:
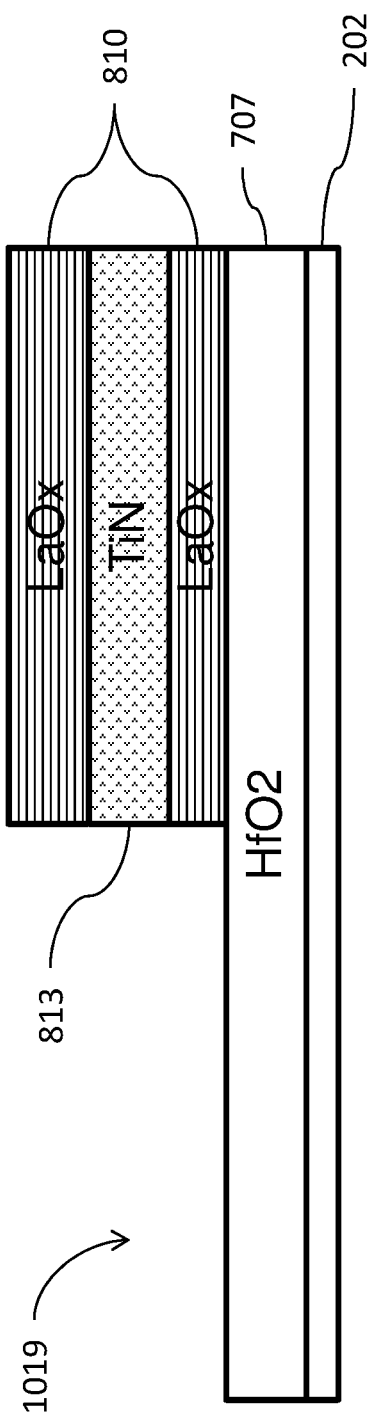

In FIG. 9, a mask 916 is applied to the structure in order to remove unprotected portions of a section of the layers 810, 813. The mask 916 can be formed of any suitable material, whether now known or developed in the future, such as a metal or organic or inorganic (Si3N4, SiC, SiO2C (diamond)) hardmask, that has etch resistance greater than the substrate and insulator materials used in the remainder of the structure. FIG. 10 shows a portion of the HfO2 layer 707 is exposed. The exposed portion, indicated generally as 1019, is formed by using a material removal process (e.g., plasma etching, wet or dry stripping, etc.) in which the mask 916 protects portions of a section of the layers 810, 813. In FIG. 11, the mask 916 and a top layer of titanium nitride have been removed using appropriate known methods, such as ashing and wet etching.

Figure 12:
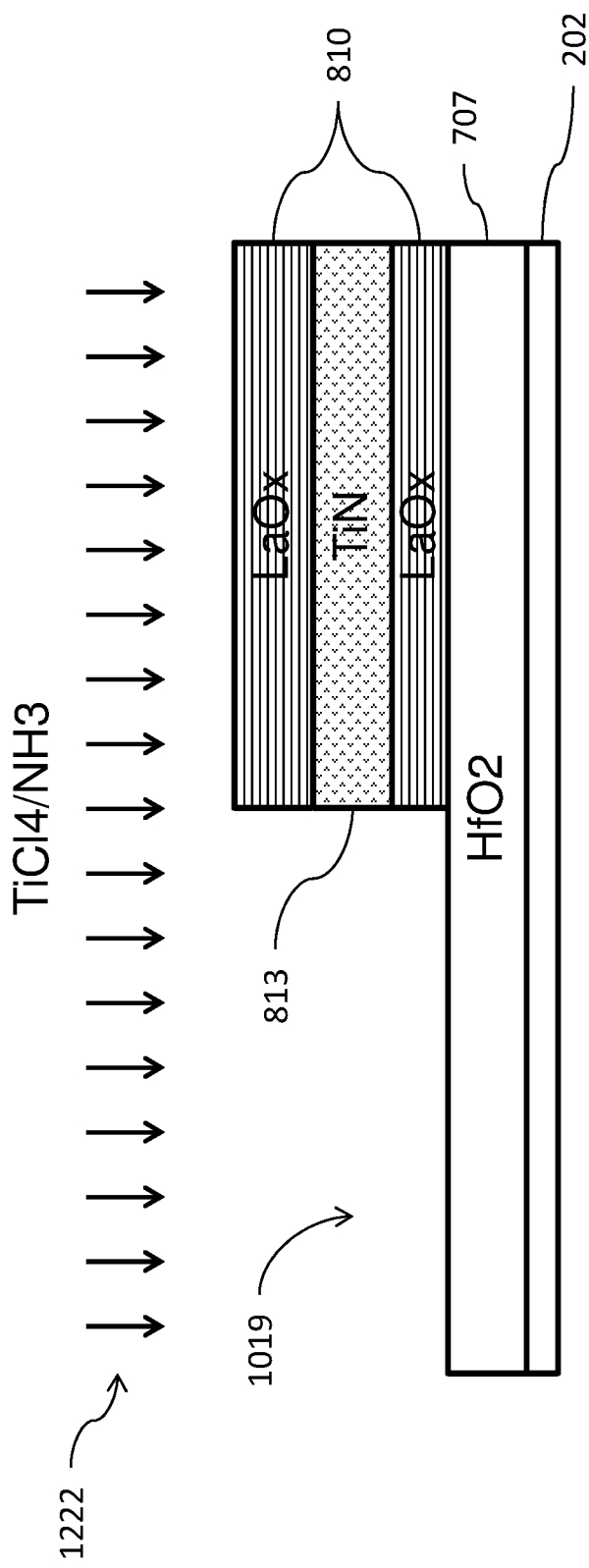

FIG. 12 shows titanium tetrachloride (TiCl4) and ammonia (NH3), indicated generally as 1222, being supplied to the structure. The remaining portion of the upper lanthanum oxide layer 810 serves as a mask, such that there is minimal titanium nitride deposition on the remaining portion of the lanthanum oxide layer 810. Several mechanisms of selective titanium nitride formation can be used.

In one example, using a first atomic layer deposition (ALD) process, titanium nitride does not grow on the lanthanum oxide surface because of the chemical reactions of the process gases. The process sequence: [TiCl4→N2 purge→NH3→N2 purge]. In particular, according to this first example, the substrate is exposed to titanium tetrachloride (TiCl4) in a process chamber. The TiCl4 reacts with the lanthanum oxide creating chlorides of lanthanum (LaClx). This happens because chlorine atoms are more chemically active than oxygen atoms, such that the lanthanum has a higher chemical affinity for the chlorine than for the oxygen. In this case, the La—Clx is desorbed from the lanthanum oxide surface, which may slightly reduce the thickness of the lanthanum oxide. At the same time, TiCl4 can react on the HfO2 surface and make HfO2-Ti—Cl. The process chamber may be purged with nitrogen (N2) and then the substrate is exposed to ammonia (NH3) in the process chamber. The NH3 can react with the Cl bond, which allows the titanium (Ti) to react with the nitrogen by the chemical reaction: TiCl4+NH3=>TiN+HCl. The titanium nitride (TiN) remains on the HfO2 surface and not on the lanthanum oxide (LaOx) surface. The process chamber may be purged again with nitrogen (N2) and the process sequence repeated to grow a titanium nitride layer on the HfO2 surface.

In another example, using a second ALD process, titanium nitride grows on the lanthanum oxide surface, which is first soaked with ammonia (NH3), because of slightly different chemical reactions of the process gases. The process sequence: NH3 soak→[TiCl4→N2 purge→NH3→N2 purge]. In particular, according to this second example, the substrate is soaked with NH3 in a process chamber. The NH3 reacts on the lanthanum oxide surface and makes lanthanum oxynitrides LaOx-N—H. Then, the substrate is exposed to titanium tetrachloride (TiCl4) in the process chamber. The TiCl4 reacts with the hydrogen bond on the lanthanum oxide surface, creating HCl. Meanwhile, the TiCl4 can react on the HfO2 surface and make HfO2-Ti—Cl. The process chamber may be purged with nitrogen (N2) and then the substrate is exposed to ammonia (NH3) in the process chamber. The NH3 can react with the Cl bond, which allows the titanium (Ti) to react with the nitrogen by the chemical reaction: TiCl4+NH3=>TiN+HCl. The titanium nitride (TiN) remains on the HfO2 surface and not on the lanthanum oxide (LaOx) surface. The process chamber may be purged again with N2 and the process sequence repeated to grow a titanium nitride layer on the HfO2 surface.

The ALD processes using TiCl4/NH3 can be performed at a temperature between 400° C. and 500° C. A temperature of approximately 450° C. can be used. In both processes, the flow rate for TiCl4 can be approximately 50 standard cubic centimeters per minute (sccm); however, the flow rate for NH3 may be significantly different for each process. For example, for the first ALD process, the NH3 flow rate can be approximately 2700 sccm, while for the second ALD process, the NH3 flow rate can be approximately 4500 sccm. In addition, the amount of time for exposure to the TiCl4 and the NH3 can be different for each process. For example, in the first ALD process, the TiCl4 may be pulsed for approximately 0.05 seconds, while in the second ALD process, the TiCl4 may be pulsed for approximately 0.4 seconds. Also, in the first ALD process, the NH3 may be pulsed for approximately 0.3 seconds, while in the second ALD process, the TiCl4 may be pulsed for approximately 1.2 seconds. This improves the growth rate of titanium nitride and preserves the thickness of the lanthanum oxide. Further, according to exemplary devices and methods herein, titanium nitride growth can be enhanced by multiple cycles of the process using TiCl4/NH3. When an ammonia (NH3) soak is used, the soaking time can be approximately 10-100 seconds.

In the first ALD process described above, the lanthanum oxide thickness may be reduced by chemical reaction in each process cycle. For example, the lanthanum oxide thickness may be reduced by approximately 10 Angstroms after 30 cycles of the TiCl4/NH3 process. However, enough lanthanum oxide thickness should be maintained to achieve the target titanium nitride thickness; otherwise, the selective titanium nitride process may be broken. The NH3 soak used in the second ALD process suppresses the etching of the lanthanum oxide in order to limit the reduction in thickness of the lanthanum oxide. In either process, the growth of titanium nitride is approximately 0.3 Angstroms per cycle.

Figure 13:
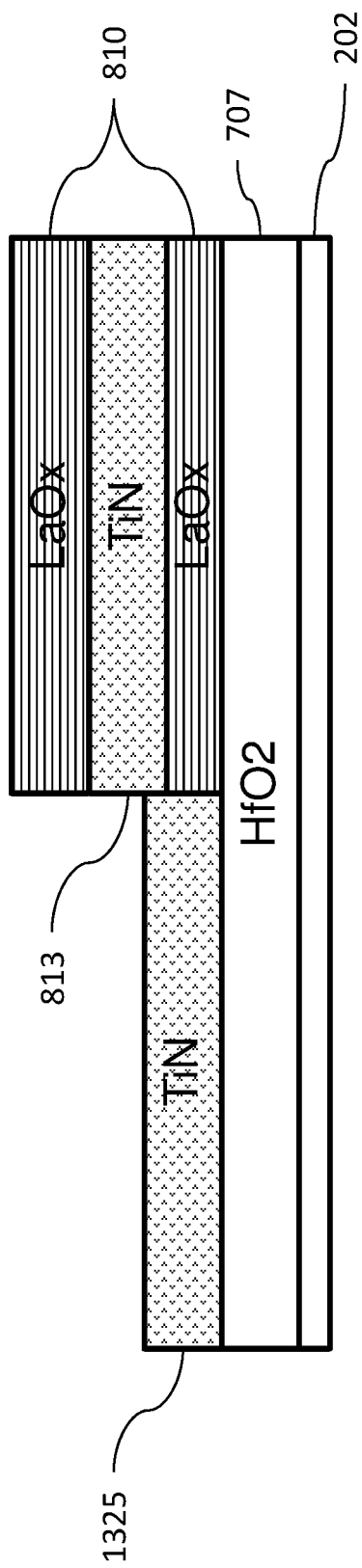
Figure 14:
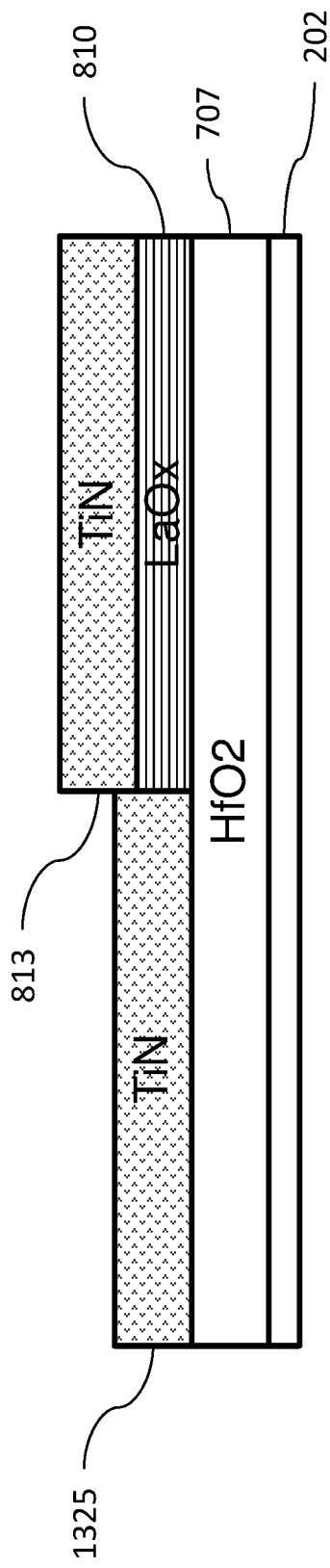

In FIG. 13, a titanium nitride layer 1325 has been formed on the exposed portion 1019 of the HfO2 layer 707. In FIG. 14, the upper layer of lanthanum oxide, which had served as a mask, may be removed. As would be known to one of ordinary skill in the art, titanium nitride is a metal that can be used as a conductor in a semiconductor device. For example, the titanium nitride can be used as a gate conductor for a transistor or other structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process can then be performed (e.g., plasma etching, etc.) to remove the unprotected portions of the material to be patterned. The resist is subsequently removed to leave the underlying material patterned according to the light exposure pattern.

Figure 15:
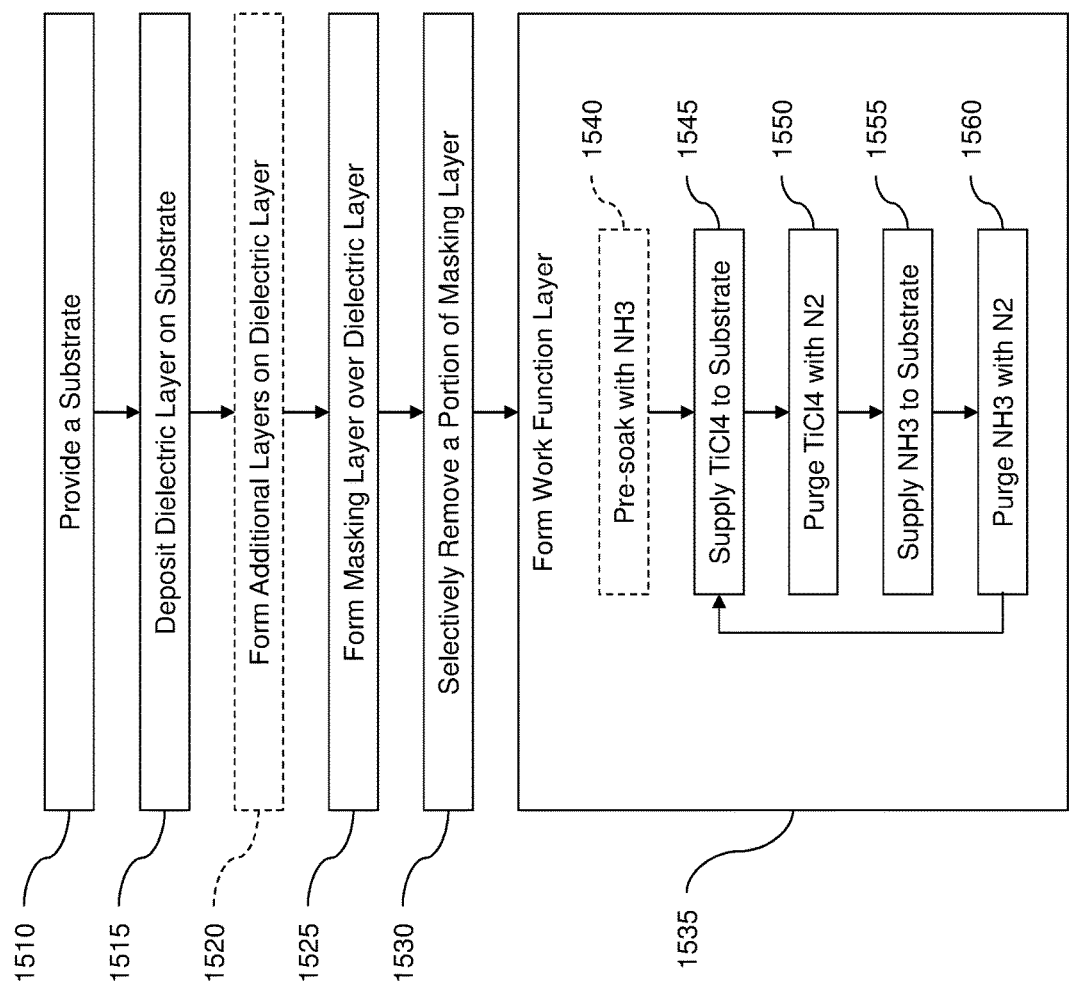
FIG. 15 is a flow diagram illustrating methods herein.

FIG. 15 is a flow diagram illustrating the processing flow of an exemplary method, such as described above. At 1510, a substrate having a top surface and a bottom surface is provided. At 1515, a dielectric layer is deposited on the top surface of the substrate. The dielectric layer may be made of hafnium dioxide (HfO2). HfO2 may be deposited by any appropriate layer deposition technique. For example, a conformal deposition process, such as chemical vapor deposition (CVD), physical vapor deposition (PVD), or any other technique known in the art, may be used. In some embodiments, additional layers may be formed on the dielectric layer, at 1520. A masking layer of lanthanum oxide is formed over the dielectric layer, at 1525. Lanthanum oxide may be deposited by any appropriate layer deposition technique. For example, a conformal deposition process, such as chemical vapor deposition (CVD), physical vapor deposition (PVD), or any other technique known in the art, may be used. If additional layers had been formed on the dielectric layer, the masking layer may be formed on the topmost additional layer. As would be known by one of ordinary skill in the art, an annealing process may be used in conjunction with the deposition of each layer. At 1530, a portion of the masking layer (and additional layers, if necessary) is selectively removed leaving an exposed region of the dielectric layer. The portion of the masking layer and additional layers can be removed by patterning and etching, as would be known to one of ordinary skill in the art. At 1535, a work function layer of titanium nitride is formed directly on the exposed region of the dielectric layer using a combination of titanium tetrachloride and ammonia (TiCl4/NH3), as described above. According to the process, in some embodiments, the masking layer of lanthanum oxide may be presoaked with ammonia (NH3), at 1540 in order to limit the reduction in thickness of the lanthanum oxide by chemical reaction. The work function layer is formed on the exposed region of HfO2. At 1545, titanium tetrachloride (TiCl4) is supplied to the substrate. The TiCl4 can react on the HfO2 surface and make HfO2-Ti—Cl. at 1550, The TiCl4 is purged with nitrogen (N2), and ammonia (NH3) is supplied to the substrate, at 1555. The NH3 can react with the Cl, which allows the Ti to react with the nitrogen by the chemical reaction: TiCl4+NH3=>TiN+HCl. The process chamber may be purged again with N2, at 1560, and the titanium nitride (TiN) can be grown by cyclically repeating the process sequence of the application of TiCl4 and NH3 to grow a titanium nitride layer on the HfO2 surface.

Figure 16B:
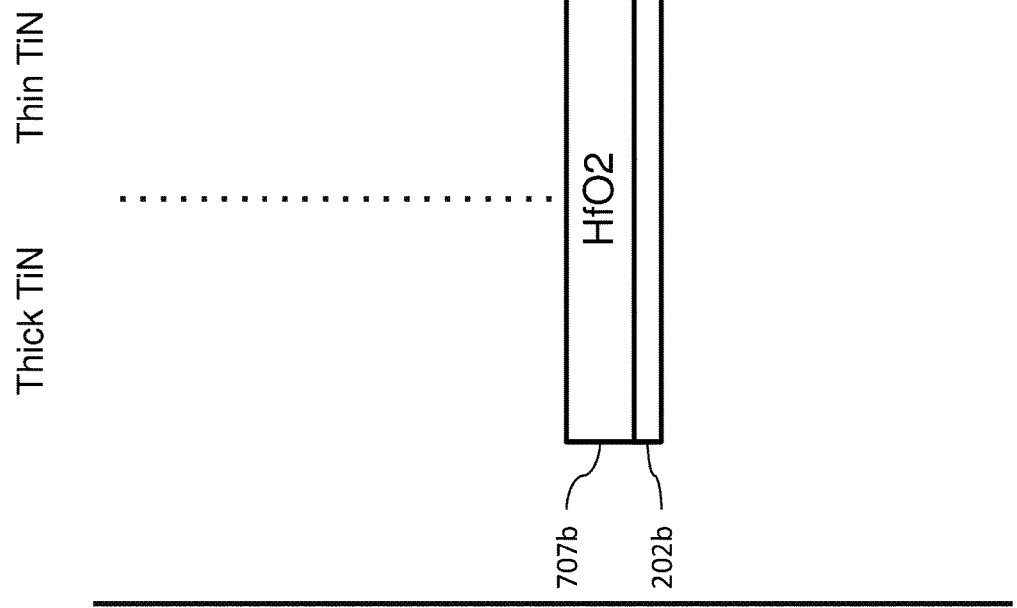
FIGS. 16A/B-23A/B are cross-section diagrams illustrating a partially completed semiconductor structure formed according to devices and methods herein.
Figure 16A:
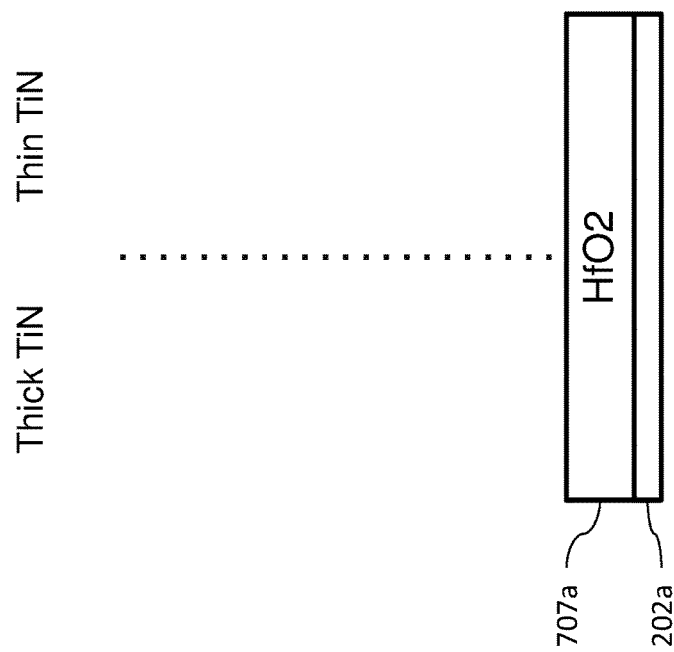
Figures 17A, 17B:
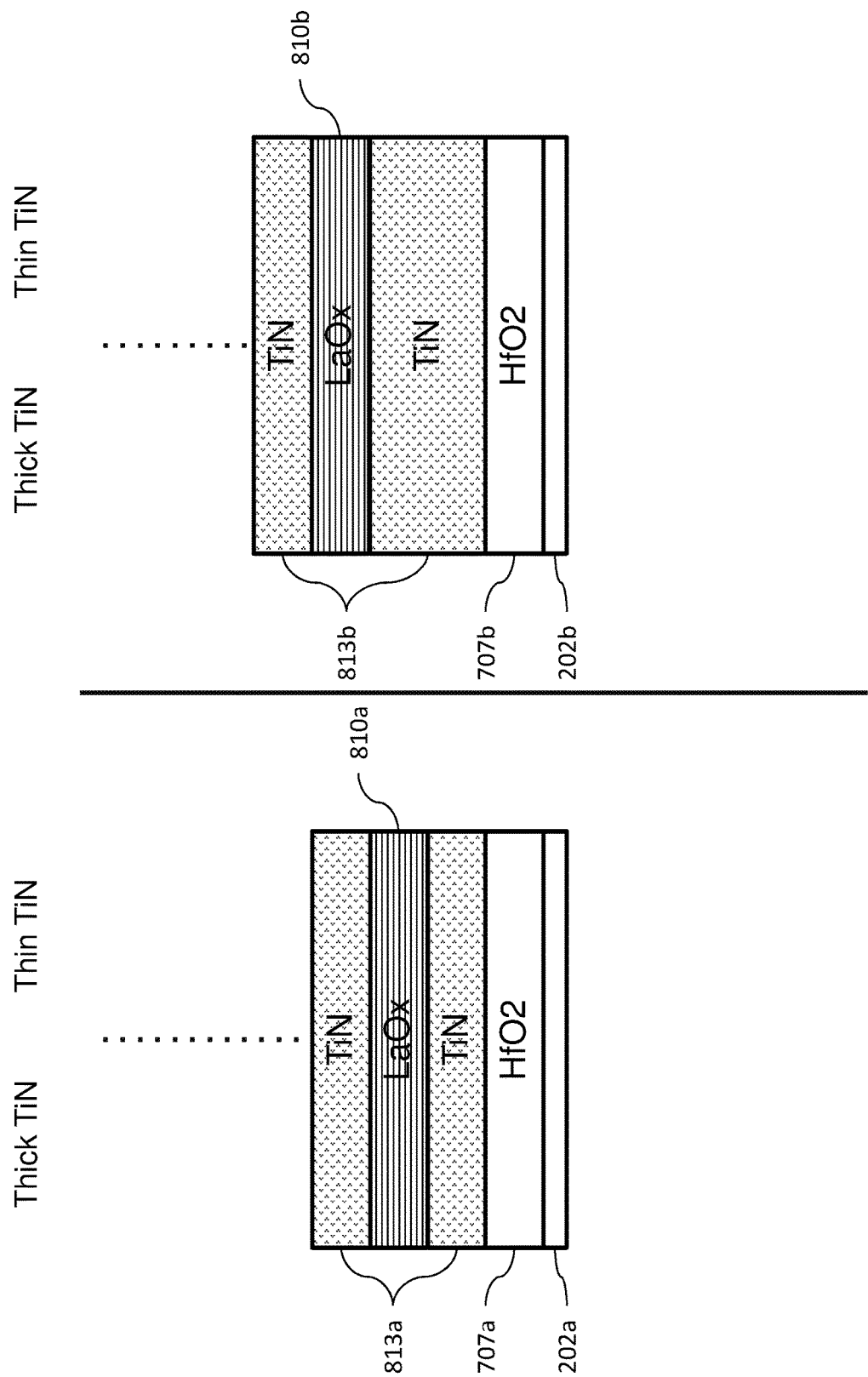

Different relative thicknesses of the resultant titanium nitride layer can be formed without an oxidized interface. FIGS. 16A/B-23A/B show side by side cross-section diagrams illustrating processing steps for forming different titanium nitride relative thicknesses. In FIGS. 16A and 16B, the substrate 202 has a layer of hafnium dioxide (HfO2) 707 deposited on the substrate 202 and annealed. As described above, the substrate 202 may be any conventional semiconductor substrate such as, for example, a bulk silicon substrate or an active layer of semiconductor material of a silicon-on-insulator (SOI). The HfO2 layer 707 is formed on the substrate 202, and a post deposition annealing (PDA) process is performed. In FIGS. 17A and 17B, a stack of layers may be formed on the HfO2 layer 707, starting with a layer of titanium nitride 813 directly on the HfO2 layer 707. A layer of lanthanum oxide 810 may be formed between layers of titanium nitride 813. Each of the layers of lanthanum oxide 810 and the layers of titanium nitride 813 may be formed by appropriate deposition and annealing, as would be known to one of ordinary skill in the art. For example, the layers 810, 813 may be formed using an atomic layer deposition technique. Alternatively, a conformal deposition process, such as chemical vapor deposition (CVD), physical vapor deposition (PVD), or any other technique known in the art, may be used. Note the lower titanium nitride layer in FIG. 17B is relatively thicker than the lower titanium nitride layer in FIG. 17A.

Figures 18A, 18B:
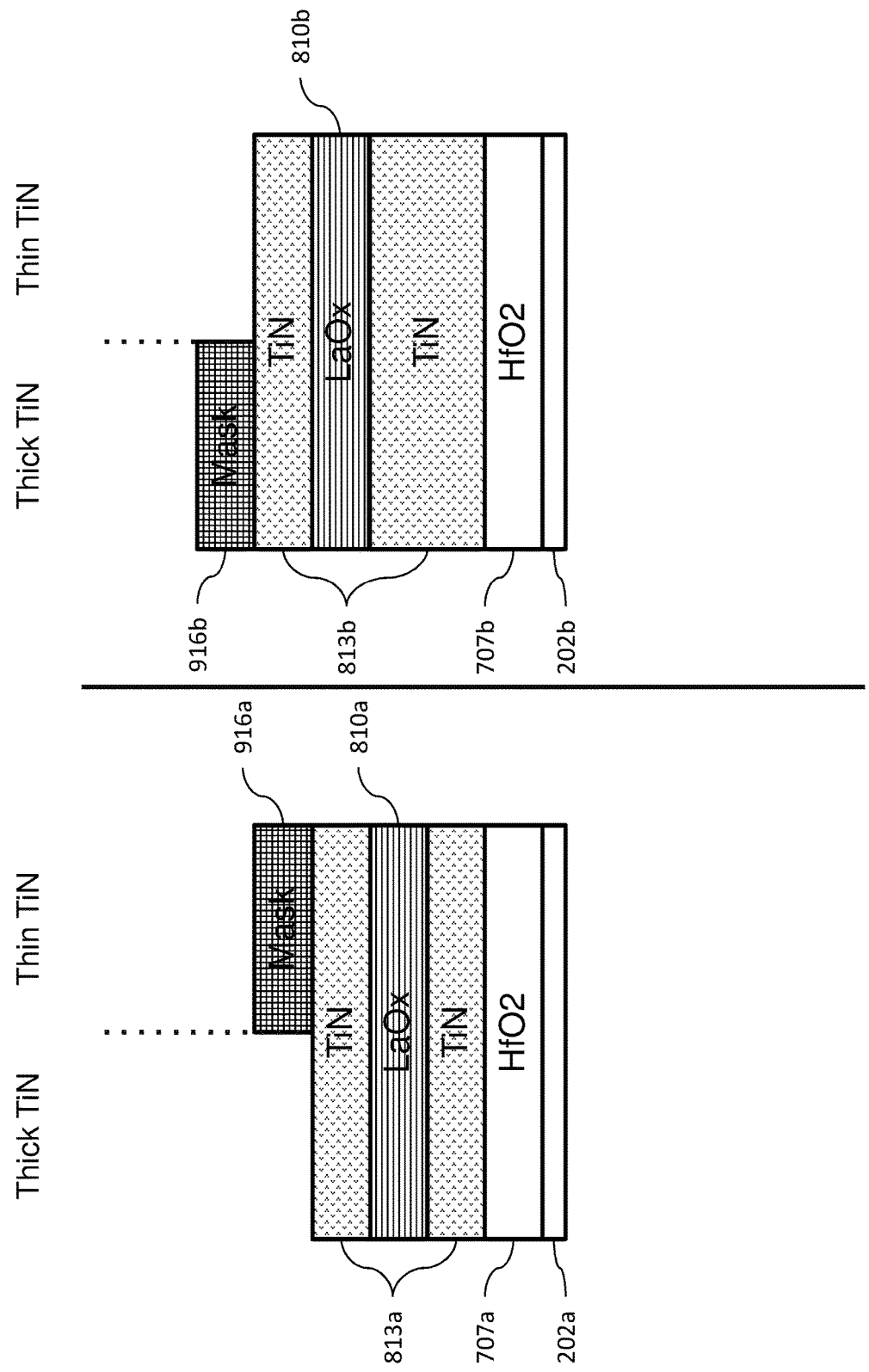
Figures 19A, 19B:
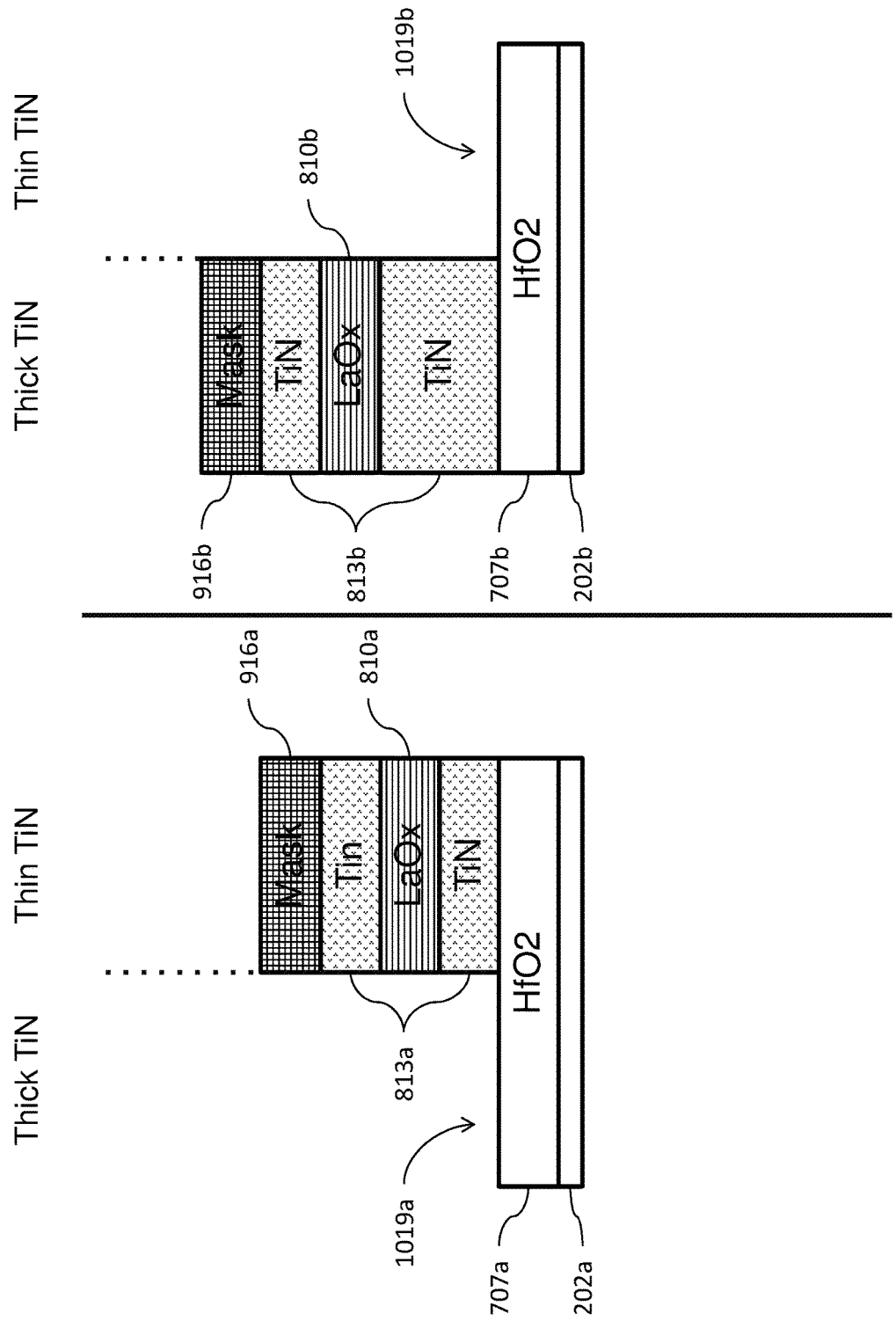
Figures 20A, 20B:
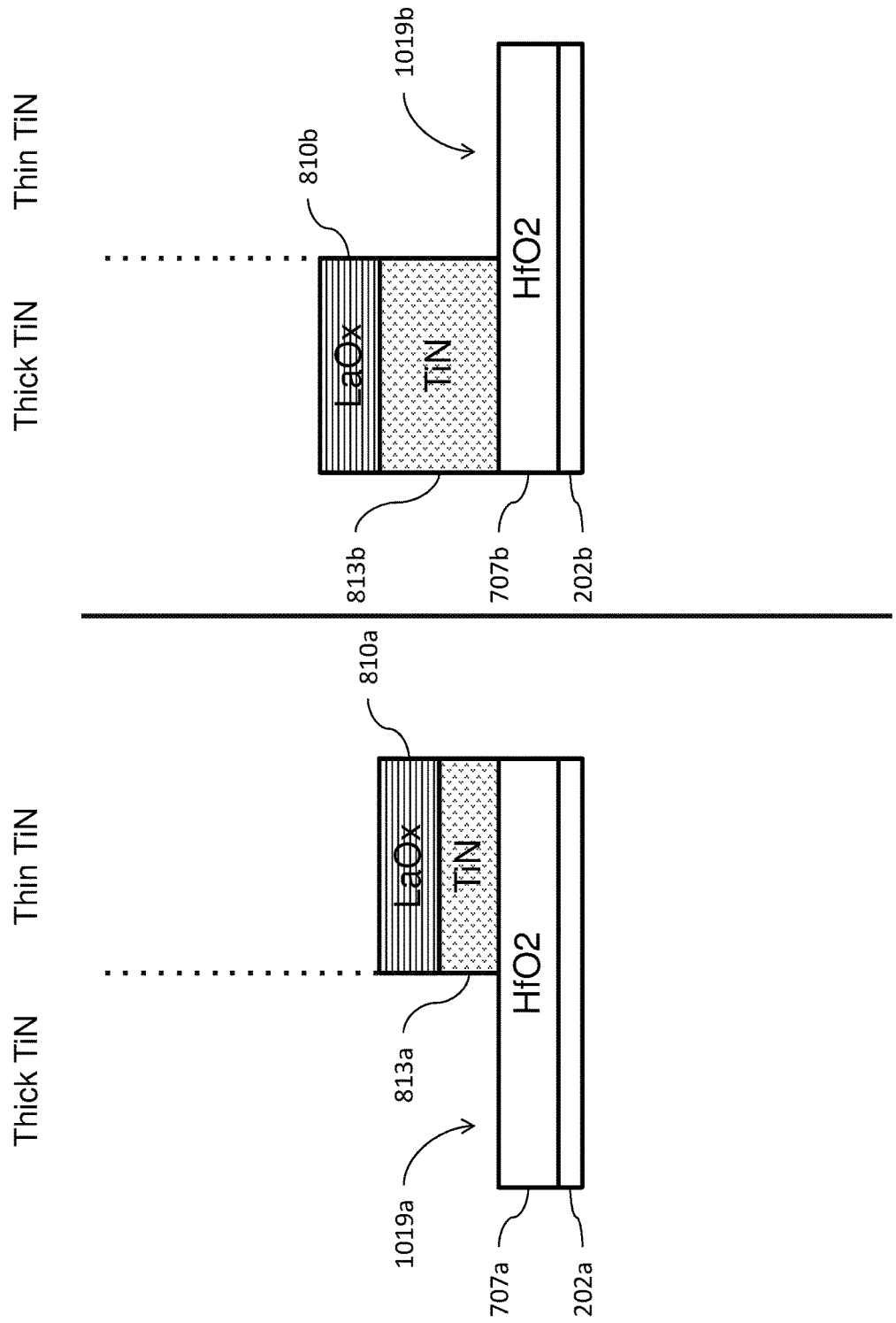

In FIGS. 18A and 18B, a mask 916 is applied to the structure in order to remove unprotected portions of a section of the layers 810, 813. The mask 916 can be formed of any suitable material, whether now known or developed in the future, such as a metal or organic or inorganic (Si3N4, SiC, SiO2C (diamond)) hardmask, that has etch resistance greater than the substrate and insulator materials used in the remainder of the structure. FIGS. 19A and 19B show a portion of the HfO2 layer 707 is exposed. The exposed portion, indicated generally as 1019, is formed by using a material removal process (e.g., plasma etching, wet or dry stripping, etc.) in which the mask 916 protects portions of a section of the layers 810, 813. In FIGS. 20A and 20B, the mask 916 and a top layer of titanium nitride have been removed using appropriate known methods, such as ashing and wet etching.

Figures 21A, 21B:
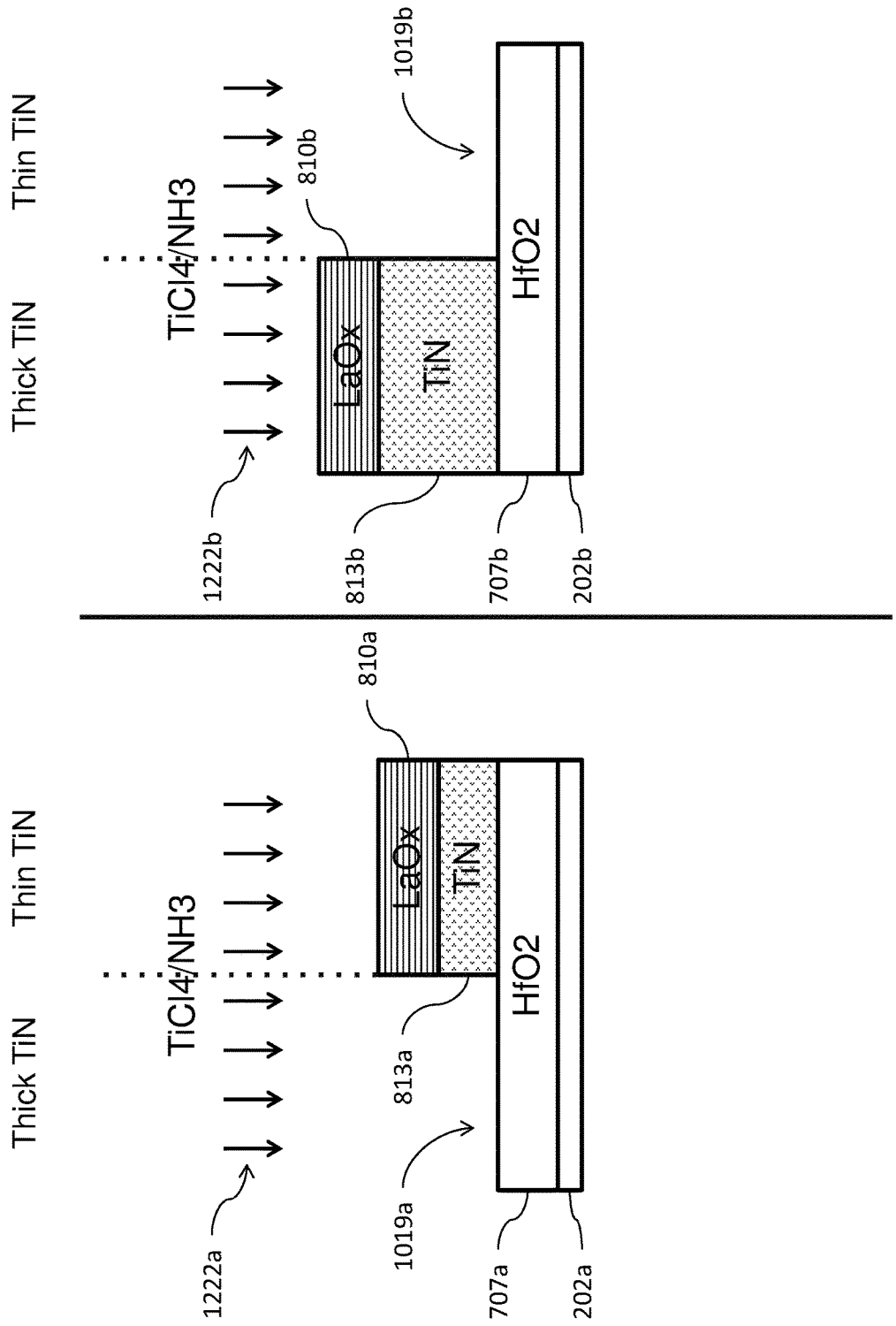

FIGS. 21A and 21B show titanium tetrachloride (TiCl4) and ammonia (NH3), indicated generally as 1222, being supplied to the structure. The remaining portion of the upper lanthanum oxide layer 810 serves as a mask, such that titanium nitride deposition is limited on the remaining portion of the lanthanum oxide layer 810. According to devices and methods herein, the TiCl4/NH3 process does not form significant amounts of titanium nitride on the lanthanum oxide surface but does form titanium nitride on the HfO2. This is because the TiCl4 reacts with the lanthanum oxide creating chlorides of lanthanum (LaClx). This happens because chlorine atoms are more chemically active than oxygen atoms, such that the lanthanum has a higher chemical affinity for the chlorine than for the oxygen. In this case, La-Clx is desorbed from the lanthanum oxide surface. Thus, selective titanium nitride deposition can be achieved by using lanthanum oxide as a mask. Several mechanisms of selective titanium nitride formation can be used.

In one example, using a first atomic layer deposition (ALD) process, titanium nitride does not grow on the lanthanum oxide surface because of the chemical reactions of the process gases. The process sequence: [TiCl4→N2 purge→NH3→N2 purge]. In particular, according to this first example, the substrate is exposed to titanium tetrachloride (TiCl4) in a process chamber. The TiCl4 reacts with the lanthanum oxide creating chlorides of lanthanum (LaClx). This happens because chlorine atoms are more chemically active than oxygen atoms, such that the lanthanum has a higher chemical affinity for the chlorine than for the oxygen. The La-Clx is desorbed from the lanthanum oxide surface, which may slightly reduce the thickness of the lanthanum oxide. At the same time, TiCl4 can react on the HfO2 surface and make HfO2-Ti—Cl. The process chamber may be purged with nitrogen (N2) and then the substrate is exposed to ammonia (NH3) in the process chamber. The NH3 can react with the Cl bond, which allows the titanium (Ti) to react with the nitrogen by the chemical reaction: TiCl4+NH3=>TiN+HCl. The titanium nitride (TiN) remains on the HfO2 surface and not on the lanthanum oxide (LaOx) surface. The process chamber may be purged again with nitrogen (N2) and the process sequence repeated to grow a titanium nitride layer on the HfO2 surface.

In another example, using a second ALD process, titanium nitride grows on the lanthanum oxide surface, which is first soaked with ammonia (NH3), because of slightly different chemical reactions of the process gases. The process sequence: NH3 soak→[TiCl4→N2 purge→NH3→N2 purge]. In particular, according to this second example, the substrate is soaked with NH3 in a process chamber. The NH3 reacts on the lanthanum oxide surface and makes lanthanum oxynitrides LaOx-N—H. Then, the substrate is exposed to titanium tetrachloride (TiCl4) in the process chamber. The TiCl4 reacts with the hydrogen bond on the lanthanum oxide surface creating HCl. Again, the TiCl4 can react on the HfO2 surface and make HfO2-Ti—Cl. The process chamber may be purged with nitrogen (N2) and then the substrate is exposed to ammonia (NH3) in the process chamber. The NH3 can react with the Cl bond, which allows the titanium (Ti) to react with the nitrogen by the chemical reaction: TiCl4+NH3=>TiN+HCl. The titanium nitride (TiN) remains on the HfO2 surface and not on the lanthanum oxide (LaOx) surface. The process chamber may be purged again with N2 and the process sequence repeated to grow a titanium nitride layer on the HfO2 surface.

Figures 23A, 23B:
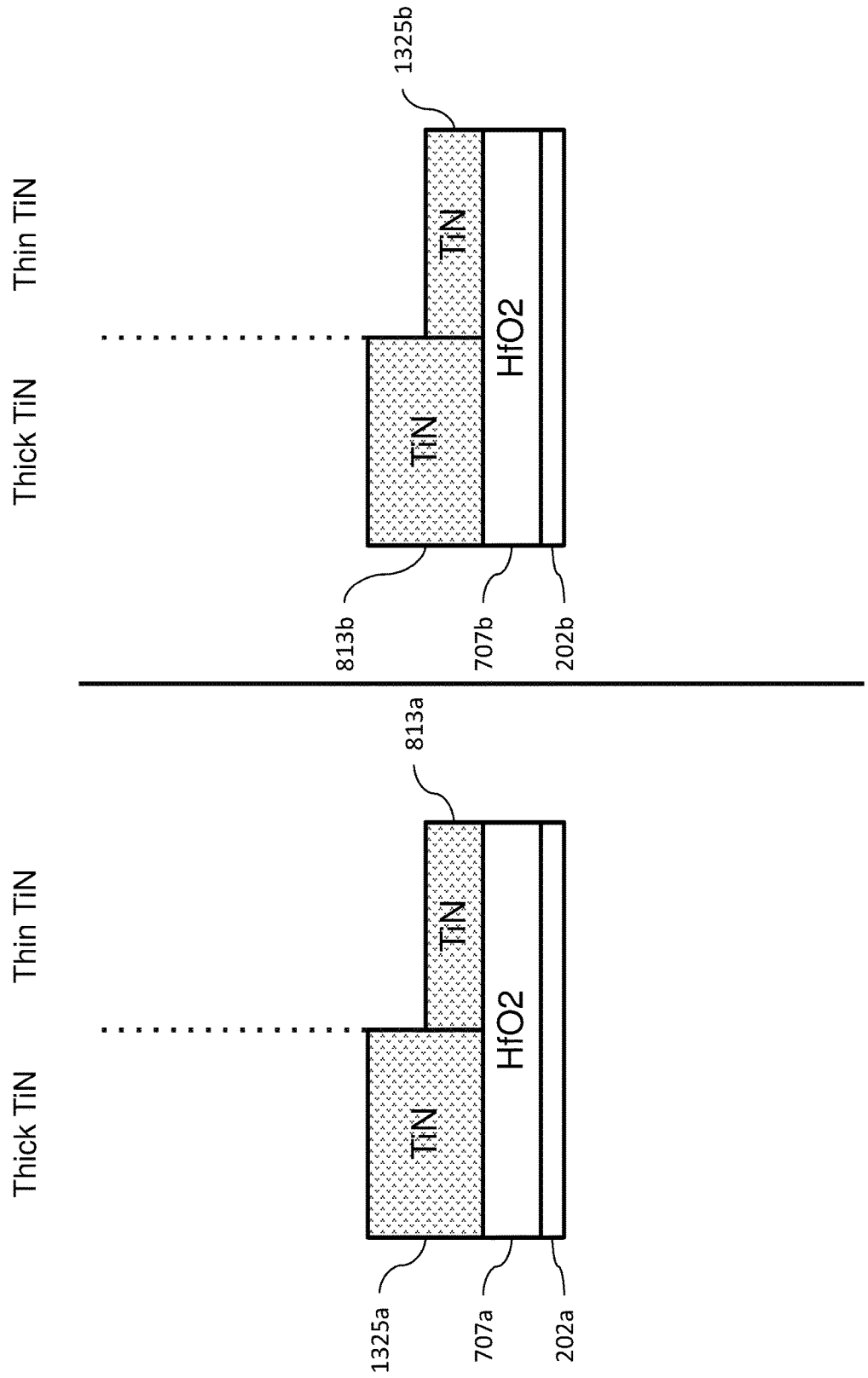

In FIGS. 22A and 22B, a titanium nitride layer 1325 has been formed on the exposed portion 1019 of the HfO2 layer 707. Note the thickness of the titanium nitride layer 1325 can be controlled by the number of cycles and the time and amount of exposure at each stage of the exposure to TiCl4/NH3. In FIGS. 23A and 23B, the upper layer of lanthanum oxide, which had served as a mask, may be removed.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method, comprising:
   depositing a dielectric layer on a substrate;
   forming a masking layer over a first region and a second region of the dielectric layer, the masking layer comprising an oxide of lanthanum;
   removing the masking layer from the second region of the dielectric layer; and
   exposing the masking layer and the second region of the dielectric layer to a titanium material to form a titanium nitride layer directly on only the second region of the dielectric layer, wherein the oxide of lanthanum prevents the titanium nitride from being formed on the masking layer.

2. The method according to claim 1, wherein removing the masking layer comprises etching the masking layer.

3. The method according to claim 1, wherein forming the titanium nitride layer further comprises:
   supplying titanium tetrachloride (TiCl4) to the substrate,
   purging the TiCl4 with nitrogen (N2),
   supplying ammonia (NH3) to the substrate, and
   purging the NH3 with N2.

4. The method according to claim 3, further comprising:
   cyclically repeating supplying TiCl4, purging with N2, and supplying NH3, to grow titanium nitride (TiN) on the dielectric layer.

5. The method according to claim 4, wherein the dielectric layer comprises hafnium dioxide (HfO2).

6. The method according to claim 5, further comprising:
   soaking the masking layer in ammonia (NH3) before supplying TiCl4 to the substrate.

7. The method according to claim 6, wherein the masking layer is soaked in ammonia for approximately 10-100 seconds.

8. The method according to claim 1, further comprising:
   forming a stack of layers on the substrate;
   patterning the stack of layers to expose the second region of the dielectric layer; and
   performing one or more lithographic processes to form the masking layer on the top of the stack of layers.

9. A method, comprising:
   providing a substrate having a top surface and a bottom surface;
   depositing a dielectric layer on the top surface of the substrate, the dielectric layer having a top surface and a bottom surface, wherein the bottom surface of the dielectric layer contacts the top surface of the substrate;
   depositing a first work function layer on the top surface of the dielectric layer, the first work function layer having a top surface and a bottom surface, wherein the bottom surface of the first work function layer contacts the top surface of the dielectric layer;
   forming a masking layer of an oxide of lanthanum over the first work function layer;
   selectively removing a portion of the masking layer and a portion of the first work function layer leaving an exposed region of the dielectric layer; and
   forming a second work function layer comprising titanium nitride directly on the exposed region of the dielectric layer by exposing the masking layer and the exposed portion of the dielectric layer to a titanium material, wherein the oxide of lanthanum prevents the titanium nitride from being formed on the masking layer.

10. The method according to claim 9, wherein removing the masking layer comprises etching the masking layer.

11. The method according to claim 9, wherein forming the second work function layer further comprises:
    supplying titanium tetrachloride (TiCl4) to the substrate,
    purging the TiCl4 with nitrogen (N2),
    supplying ammonia (NH3) to the substrate, and
    purging the NH3 with N2.

12. The method according to claim 11, further comprising:
    cyclically repeating supplying TiCl4, purging with N2, and supplying NH3, to grow titanium nitride (TiN) on the dielectric layer.

13. The method according to claim 12, further comprising:
    adjusting the height of the second work function layer relative to the height of the first work function layer by controlling the number of cycles for forming the second work function layer.

14. The method according to claim 11, further comprising:
    soaking the masking layer in ammonia (NH3) before supplying TiCl4 to the substrate.

15. The method according to claim 14, wherein the masking layer is soaked in ammonia for approximately 10-100 seconds.

16. The method according to claim 9, wherein the dielectric layer comprises hafnium dioxide (HfO2).

17. The method according to claim 9, further comprising:
    forming a stack of layers on the substrate;
    patterning the stack of layers to leave the exposed region of the dielectric layer; and
    performing lithographic processes to form the masking layer on the top of the stack of layers.

* * * * *